(12) United States Patent
Islam et al.

(10) Patent No.: US 7,622,332 B2
(45) Date of Patent: Nov. 24, 2009

(54) PARTIALLY PATTERNED LEAD FRAMES AND METHODS OF MAKING AND USING THE SAME IN SEMICONDUCTOR PACKAGING

(75) Inventors: Shafidul Islam, Plano, TX (US); Romarico Santos San Antonio, Batam Island (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 464 days.

(21) Appl. No.: 11/197,944

(22) Filed: Aug. 4, 2005

(65) Prior Publication Data
US 2005/0263864 A1 Dec. 1, 2005

Related U.S. Application Data

(63) Continuation of application No. 10/916,093, filed on Aug. 10, 2004, now Pat. No. 7,129,116, which is a continuation of application No. 10/134,882, filed on Apr. 29, 2002, now Pat. No. 6,812,552.

(51) Int. Cl.
*H01L 21/00* (2006.01)
*H01R 43/00* (2006.01)
(52) U.S. Cl. ........................................ 438/123; 29/827
(58) Field of Classification Search .................. 438/611, 438/6, 111, 123, 128, 518, 618; 174/50.54; 29/827
See application file for complete search history.

(56) References Cited

U.S. PATENT DOCUMENTS

| | | | |
|---|---|---|---|
| 4,038,488 A | * | 7/1977 | Lin .......................... 174/50.54 |
| 4,368,168 A | | 1/1983 | Slepcevic |
| 5,656,550 A | | 8/1997 | Tsuji et al. |
| 5,703,407 A | | 12/1997 | Hori |

(Continued)

FOREIGN PATENT DOCUMENTS

EP 977251 2/2000

(Continued)

OTHER PUBLICATIONS

International Search Report for PCT/IB03/04632, mailed Mar. 3, 2004.

(Continued)

*Primary Examiner*—Davienne Monbleau
*Assistant Examiner*—Monica D Harrison
(74) *Attorney, Agent, or Firm*—White & Case LLP

(57) ABSTRACT

A method of making a lead frame and a partially patterned lead frame package with near-chip scale packaging (CSP) lead-counts is accomplished by performing a major portion of the manufacturing process steps with a partially patterned strip of metal formed into a web-like lead frame on one side, so that the web-like lead frame, which is solid and flat on the other side is also rigid mechanically and robust thermally to perform without distortion or deformation during the chip-attach and wire bond processes, both at the chip level and the package level. The bottom side of the metal lead frame is patterned to isolate the chip-pad and the wire bond contacts only after the front side, including the chip and wires, is encapsulated. The resultant package being electrically isolated enables strip testing and reliable singulation without having to cut into any additional metal.

12 Claims, 12 Drawing Sheets

U.S. PATENT DOCUMENTS

| | | | |
|---|---|---|---|
| 5,767,574 A | 6/1998 | Kim et al. | |
| 5,847,458 A | 12/1998 | Nakamura et al. | |
| 5,896,651 A | 4/1999 | Hawthorne | |
| 5,936,303 A | 8/1999 | Nishi | |
| 6,001,671 A | 12/1999 | Fjelstad | |
| 6,054,755 A | 4/2000 | Takamichi et al. | |
| 6,093,584 A | 7/2000 | Fjelstad | |
| 6,143,981 A | 11/2000 | Glenn | |
| 6,232,650 B1 | 5/2001 | Fujisawa et al. | |
| 6,238,952 B1 | 5/2001 | Lin | |
| 6,291,274 B1 | 9/2001 | Oida et al. | |
| 6,294,830 B1 | 9/2001 | Fjelstad | |
| 6,316,727 B1 | 11/2001 | Liu | |
| 6,348,399 B1 | 2/2002 | Lin | |
| 6,355,199 B1 | 3/2002 | Briar et al. | |
| 6,373,140 B1 | 4/2002 | Onodera et al. | |
| 6,451,627 B1 | 9/2002 | Coffman | |
| 6,498,099 B1 | 12/2002 | McLellan et al. | |
| 6,534,849 B1 | 3/2003 | Gang | |
| 6,545,364 B2 | 4/2003 | Sakamoto et al. | |
| 6,576,539 B1 * | 6/2003 | Lin ............................ | 438/611 |
| 6,585,905 B1 | 7/2003 | Fan et al. | |
| 6,635,957 B2 | 10/2003 | Kwan et al. | |
| 6,657,293 B1 | 12/2003 | Fumihira | |
| 6,798,121 B2 | 9/2004 | Nakatani et al. | |
| 6,821,821 B2 | 11/2004 | Fjelstad | |
| 6,856,235 B2 | 2/2005 | Fjelstad | |
| 6,872,661 B1 | 3/2005 | Kwan et al. | |
| 6,906,423 B1 | 6/2005 | Asakawa et al. | |
| 6,933,594 B2 | 8/2005 | McLellan et al. | |
| 6,989,294 B1 | 1/2006 | McLellan et al. | |
| 6,995,460 B1 | 2/2006 | McLellan et al. | |
| 7,144,800 B2 | 12/2006 | Mostafazadeh et al. | |
| 2001/0020546 A1 | 9/2001 | Eldridge et al. | |
| 2001/0045625 A1 | 11/2001 | Sakamoto et al. | |
| 2001/0045640 A1 | 11/2001 | Oida et al. | |
| 2001/0050370 A1 | 12/2001 | Sakamoto et al. | |
| 2001/0052600 A1 | 12/2001 | Sakamoto et al. | |
| 2002/0027010 A1 | 3/2002 | Glenn | |
| 2002/0041019 A1 | 4/2002 | Gang | |
| 2002/0053745 A1 | 5/2002 | Lin | |
| 2002/0089053 A1 | 7/2002 | Liu et al. | |
| 2002/0105069 A1 | 8/2002 | Kawahara et al. | |
| 2002/0159242 A1 | 10/2002 | Nakatani et al. | |
| 2003/0127711 A1 | 7/2003 | Kawai et al. | |
| 2003/0170922 A1 | 9/2003 | Sakamoto et al. | |

FOREIGN PATENT DOCUMENTS

| | | |
|---|---|---|
| EP | 1162669 | 12/2001 |
| EP | 1189272 | 3/2002 |
| JP | 11-186294 | 7/1999 |
| JP | 11-195742 A | 10/1999 |
| JP | 2000-150760 | 5/2000 |
| JP | 2000-188309 | 7/2000 |
| JP | 2001-127199 | 5/2001 |
| JP | 2002-76245 | 3/2002 |
| JP | 2002-76246 | 3/2002 |
| KR | 2001-0008926 | 2/2001 |
| TW | 464053 | 11/2001 |
| WO | WO-03-103038 A1 | 12/2003 |
| WO | WO-2004-064144 A2 | 7/2004 |
| WO | WO-2004-030030 A2 | 8/2004 |
| WO | WO-2008-057770 | 5/2008 |

OTHER PUBLICATIONS

Written Opinion for PCT/IB03/04632, mailed Jun. 6, 2004.
International Preliminary Examination Report for PCT/IB03/04632, completed Dec. 15, 2004.
International Search Report for PCT/US03/13046, mailed Sep. 23, 2003.
Written Opinion for PCT/US03/13046, mailed Feb. 25, 2004.
International Preliminary Examination Report for PCT/US03/13046, completed May 27, 2004.
International Search Report for PCT/GB04/00123, mailed Sep. 30, 2004.
Written Opinion for PCT/GB04/00123, mailed Sep. 30, 2004.
International Preliminary Examination Report for PCT/GB04/00123, completed Jan. 20, 2005.
International Search Report for PCT/GB2004/000123, dated Sep. 30, 2004.
PCT Written Opinion for PCT/GB2004/000123, dated Sep. 30, 2004.
"Surface Finishing for Lead Free", by George Milad, Uyemura International Corp., Southington, Connecticut, http://www.uyemura.com/library-4.htm.
"Immersion tin: Its chemistry, metallurgy, and application in electronic packaging technology", by Kovac et al., IBM J. Res. Develop., vol. 28, No. 6 (Nov. 1984), 726 (Abstract).
International Search Report dated Apr. 22, 2008 cited in International Application No. PCT/US2007/082423.
Written Opinion dated Apr. 22, 2008 cited in International Application No. PCT/US2007/082423.
International Preliminary Report on Patentability for PCT/US2007/082423, issued Apr. 28, 2009.

* cited by examiner

US 7,622,332 B2

PARTIALLY PATTERNED LEAD FRAMES AND METHODS OF MAKING AND USING THE SAME IN SEMICONDUCTOR PACKAGING

This application is a continuation of U.S. patent application Ser. No. 10/916,093, filed Aug. 10, 2004, now U.S. Pat. No. 7,129,116 which is a continuation of Ser. No. 10/134,882, filed Apr. 29, 2002, now U.S. Pat. No. 6,812,552.

FIELD OF THE INVENTION

The invention relates to electronic packaging in general, and more particularly, to a partially patterned lead frame and a method for making and using the same. The partially patterned lead frame is stronger and more stable than conventional lead frames. The sturdiness of the partially patterned lead frame improves the process of manufacturing lead frame packages and enhances the overall reliability of the end product.

BACKGROUND OF THE INVENTION

In making electronic packages that use lead frames, there are several process steps that subject the lead frames to mechanical and thermal stresses. The finer geometries of current lead frames and the ever-increasing integration of circuits on semiconductor chips have resulted in processing that places even greater stress on the lead frames. Finely configured lead frames often resemble very delicate embroidery, or stencil-like metal structures that tend to bend, break, disfigure and deform easily. (See FIGS. 1a and 1b). Such conventional lead frames are used in the industry to create a variety of chip packages, including wire bonded and flip-chip (FC) packages. (See FIGS. 2a-2d and 3a-3b).

Conventional lead frames generally lack structural rigidity. The finger-like portions of lead frames can be quite flimsy and difficult to hold in position. This lends to handling flaws, damage and distortion in assembly processes and complicated wire bonding situations. Consequently, bond parameters have to be optimized to compensate for lead frame bouncing during the bonding process. A failure to optimize the bonding parameters to compensate for the mechanical instability of the lead frame can result in poor bond adhesion, and hence poor quality and poor reliability of the bond.

The finger-like portions of a typical lead frame extend from a central portion, known as the chip receiving area, also known as a chip-pad. The chip is usually attached to the receiving area with the backside down, and the front side is positioned face up with terminals located peripherally on the perimeter of the chip, or over the surface of the chip in the form of an array. The receiving area typically has dimensions of about 5 mm×5 mm, and the leads extending outwardly from the chip-pad area have typical dimensions of about 10 mm long×1 mm wide×0.5 mm thick. The lead frame is typically held down by a vacuum chuck and mechanical clamps. The chuck and clamps must be refitted for lead frames of different sizes and shapes. The present invention alleviates this problem.

The prior art has not shown any lead frames that can withstand the stresses encountered in current semiconductor packaging processes and that can be manufactured in a cost effective manner. The present invention achieves this objective by providing a partially patterned lead frame that not only improves the manufacturability of the lead frame itself, but also improves the integrity and reliability of the electronic packages that are formed therefrom.

SUMMARY OF THE INVENTION

The present invention provides a partially patterned lead frame for use in semiconductor packaging. The lead frame is composed of a film having a top surface and a bottom surface. A first region of the film is partially patterned from the top surface but not entirely through the film to the bottom surface. A second region of the film, not patterned from the top surface, forms a chip receiving area for supporting an integrated circuit (IC) chip and a plurality of lead contacts for providing electrical connections to the IC chip. The first region forms trenches in the film and creates a webbed structure that interconnects the second region that is not partially patterned from the top surface. The present invention is also directed to a method of manufacturing partially patterned lead frames and to electronic packages made utilizing the lead frames. The lead frame of the invention has improved structural rigidity because of its web-like, or webbed structure.

According to the invention, the top surface of a metal film, from which the lead frame is to be formed, is first patterned using standard photolithographic techniques or similar techniques to outline the areas that will correspond to a chip receiving area and leads. At the next step, etching is performed in the first region of the film outside the outlined areas from the top surface of the film partially through the thickness of the underlying film to create a lead frame pattern in the film. After the partial patterning, the remaining areas not patterned from the top surface form a second region which will serve as a chip receiving area and leads along the top surface. The first region forms a recessed webbed region below the top surface of the film. The webbed structure of the first region connects the lead portions to each other and to the chip receiving area. Thus, the partially patterned film looks similar to a webbed foot and retains its rigidity and strength so it can withstand the forces of subsequent manufacturing process steps. In particular, the partially patterned lead frame can withstand the forces encountered during wire bonding and encapsulation processes. In some embodiments, the chip receiving area and electrical leads can be formed from the same parts of the second region (e.g., in the case where the electrical leads support the integrated chip as well as provide electrical connection thereto).

The present invention also provides a unique method of making a plurality of electronic packages using partially patterned lead frames. The method involves a film having a top surface and a bottom surface. In the first region, the film is partially patterned from the top surface but not entirely through to the bottom surface. The remaining second region on the film not partially patterned from the top surface forms a plurality of partially patterned lead frames. Each of the lead frames has a chip receiving area for supporting an integrated circuit (IC) chip and a plurality of electrical leads for providing electrical connections to the IC chip.

The first region of the film forms a webbed structure that interconnects the chip receiving areas and electrical leads of each lead frame. The first region also connects the plurality of lead frames to one another in street portions of the film.

A plurality of chips is provided, each chip having a plurality of electrical terminals for attachment to a corresponding lead frame. Each chip is attached to the chip receiving area on a corresponding lead frame and an electrical connection is formed between at least one terminal of each chip and one of the electrical leads of the lead frame. Thereafter, an encapsulant material is applied over the lead frames and the street portions of the film to completely cover the top of the film. Once the encapsulant material is dried, a back patterning process is performed from the bottom surface of the film in the first region to remove the webbed structure and the street portions of the film. The encapsulant material disposed over the street portions of the film is then singulated to form individual packages.

In a preferred embodiment, the method includes forming the lead frames into the film in a matrix in a block/window pattern, and involves the production of chip scale packages.

Several advantages arise from the partially patterned lead frame of the present invention. The flat and solid un-etched bottom surface of the lead frame serves as an excellent heat sink during the wire bonding process. This provides even heat transfer for better and more consistent bond quality. Additionally, the solid structure provides a continuous surface for a universal vacuum chuck to hold the lead frame down, thereby making the chip-attachment process more stable and the leads more secure during the subsequent process steps. Awkward clamping of outer edges of the lead frame is eliminated to allow an array-matrix lead frame design and processing without conversion needs. Because the bottom side of the partially patterned lead frame is a flat continuous surface, a universal vacuum chuck may be used to hold down many different sizes of frames. This removes the complication of having to refit the vacuum chuck each time a lead frame of different dimensions is being employed in the packaging process. Also, there is no further need for clamping. The use of a universal vacuum chuck and elimination of clamping enables construction of dual or triple rows of staggered leads on the second region for higher lead counts.

The present invention is directed to a partially patterned lead frame that will accommodate not only wire-bonded chips but also solder bumped flip-chips. In addition, the invention teaches methods of using the partially patterned lead frame for making etched lead frame packages (ELPs) that use wire-bonding, ELPs with flip-chips (ELPFs), and also ELPs or ELPFs with land grid array (LGA) pads to form etched land grid array (ELGA) packages, as further described in the embodiments of the present invention.

Flip Chip (FC) technology is one more step towards fully automated joining of the electrical terminals on a chip to the next level of packaging, namely, to a ceramic or plastic substrate, or to a chip microcarrier that is later joined to the substrate. The microcarrier, which is only slightly larger than the chip itself, is now called the chip scale package (CSP). FC technology evolved from tape automated bonding (TAB) which in turn had its origins in wire bonding (WB). Whereas in WB and TAB the chip is positioned on its back surface and electrical connections are made to the terminals located around the perimeter on its top surface, in FC technology the orientation of the chip is reversed. The chip is placed face downward and the back side of the chip oriented upward. This flip-chip orientation has a significant advantage in that it concentrates the electrical functions on the underside of the chip, leaving the top side free for use in developing a highly efficient heat transfer design.

In the FC process, the chip terminals or bond pads are sealed with different types of bumps over the surface of the chip, where the patterns may be deployed in an area array, peripheral patterns or other patterns. The chip may be attached to the next level in the following ways: a) FC attachment to a lead frame; b) FC attachment of a layer/substrate, known as an interposer, for re-routing the connection spacing on a lead frame; c) FC attachment to a pre-attached interposer on a lead frame; or d) FC attachment to a printed circuit board using conventional techniques, including chip reflow methods.

Chip attachment using conventional techniques becomes especially difficult when applied to QFN (Quad Flat No Lead) lead frames in making QFN packages and derivatives thereof, such as VFQPF-N. This is because conventional lead frames in general lack structural rigidity. Finger-like portions of lead frames can be quite flimsy and difficult to hold in one precise position. This lends to handling flaws, damage and distortion in assembly processes and complicated chip bonding situations. FC joining processes require precise alignment of bumped solder heads against the hanging and flimsy lead ends of the lead frame. Furthermore, the wetted solder ends must retain their positions after placement through the solder reflow process. Consequently, reflow parameters have to be optimized to compensate for lead frame bouncing during chip joining, which, if not properly done, can result in poor joints, and hence poor quality and poor reliability of the end product.

It is common practice to form the conventional stencil-like lead frames by patterning a photoresist on a strip of metal, or metal film, and etching through the pattern to form the finger-like leads extending outwardly from the chip receiving area. It is also customary to use "tie-bars" between the fingers so that the fingers are kept apart during the various process steps, as was shown in FIGS. 3a and 3b. The present invention alleviates the problem of the lack of structural rigidity of the lead frame by forming a web-like, partially patterned lead frame instead of a stencil-like lead frame.

In accordance with a method of the present invention, all the major process steps of forming a semiconductor package are performed from one side of the film that is to become a lead frame. The other side, namely, the bottom side, remains flat and untouched on a surface, such as the surface of a vacuum chuck. This includes the step of encapsulating and hermetically sealing the partially formed front side of the package. Once the encapsulation is completed, the bottom surface is back-etched to remove selectively the webbed portions that connect the leads to each other and to the chip receiving area. In the ELP case, where the chip is back-bonded to a chip-pad at the chip receiving area and the electrical connection to the chip terminals is made by means of wire bonding, all intermediate webbed portions are severed through etching so that the chip-pad and the lead contacts at the wire bonded end are now isolated from each other by the molding material that surrounds the chip, the wires and the front surfaces of the wire-bonded contact areas. In the case of the ELPF package, however, only the webbed portions that connect the leads to each other are severed through etching, since leads themselves that are connected to the chip solder headed bumps provide the electrical connection to the next level of packaging.

The removal of embedded metal through the saw thickness, or streets, in the webbed portions has several advantages, including the elimination of the saw forces propagating throughout the lead frame structure, and hence, the prevention of the delamination at the metal-plastic interfaces. Also, the electrical isolation through back-etching enables strip testing prior to any sawing or singulation, or for that matter, prior to any further processing steps. After the back patterning, the remaining and exposed metal portions on the bottom surface can then be flash finished with any number of solderable materials through immersion-tin dipping or electroless-nickel plating. The ELGA package uses the FC of the ELPF package, however, with LGA pads for connection to the next level of packaging.

In order to prevent any separation between the molding material and other components of the package during manufacturing, the present invention also teaches how to form locking features on the exposed vertical walls of the recessed webbed portions of the partially etched lead frame, such as on the side walls of the leads, that will come in contact with the molding material, such as a resin. As an alternative, it is also taught to form "lips" on the edges of the chip-pad and lead contacts so as to capture the molding material under each lip, thereby making it difficult for the molding material to separate from the mating surfaces.

BRIEF DESCRIPTION OF THE DRAWINGS

FIGS. 6b and 6c show progressively enlarged top views of the lead frames in the matrix shown in 6a.

DETAILED DESCRIPTION

FIGS. 4-15b and FIGS. 16-24b show different embodiments of forming a partially patterned lead frame package with lead counts comparable to that of near-chip scale packages (CSPs). The method of the invention improves the automation of the manufacturing line and the quality and reliability of the packages made therefrom. This is accomplished by performing a major portion of the manufacturing process steps with a partially patterned metal film formed into a web-like lead frame on one side. In contrast with conventionally punched through stencil-like lead frames, the lead frame used in the invention is partially patterned on one side and is solid and flat on the other side. This construction is improved both mechanically and thermally, and performs without distortion or deformation during the chip-attach, wire bond, and encapsulation processes. After the chip attach and wire bonding process steps are completed and the chip and wire bonds are affixed and hermetically encapsulated in a molding material, the bottom surface is etched entirely through the film to isolate the lead contacts from the chip-pad and each other. Subsequently, the resultant encapsulated package is singulated without having to cut into any additional metal.

More specifically, FIGS. 4-15b show the forming of a partially patterned lead frame for a wire-bonded chip and a method of using the same for forming an ELP-type electronic package. FIGS. 16-22, on the other hand, show the forming of a partially patterned lead frame for a flip-chip and a method of using the same for forming an ELPF-type electronic package. A method of forming an ELGA-type of electronic package, using the instant partially patterned lead frame, is also described in connection with FIGS. 24a and 24b.

Figure 1A:
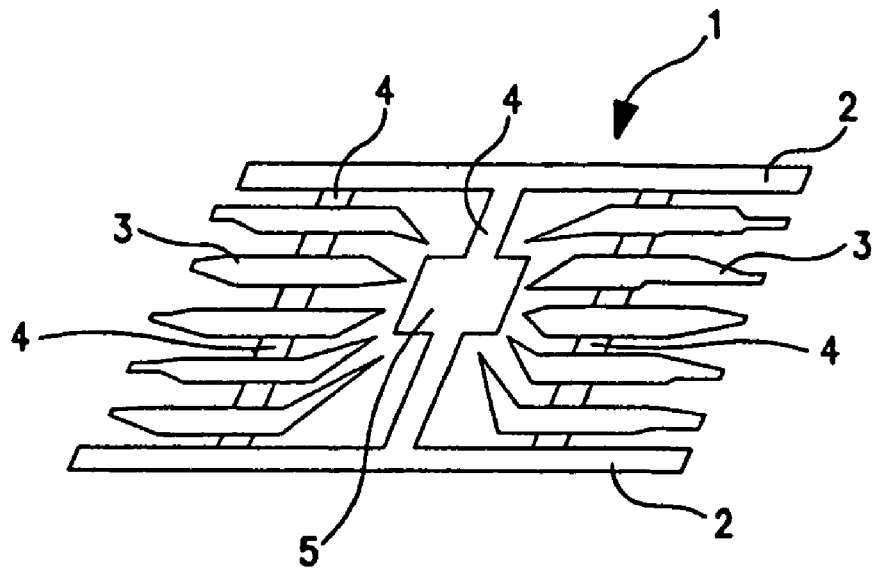
FIG. 1a is a diagram of a conventional lead frame with leads and a chip-pad area, according to prior art.
Figure 1B:
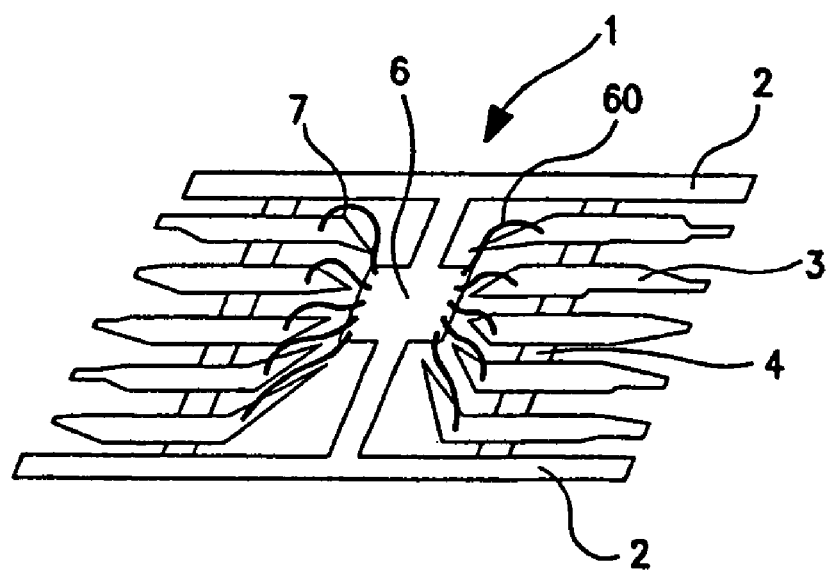
FIG. 1b is a diagram of the conventional lead frame of FIG. 1a showing the attachment of a chip to the chip-pad, and the wire bonding of the terminals on the chip to the leads, according to prior art.
Figure 2A:
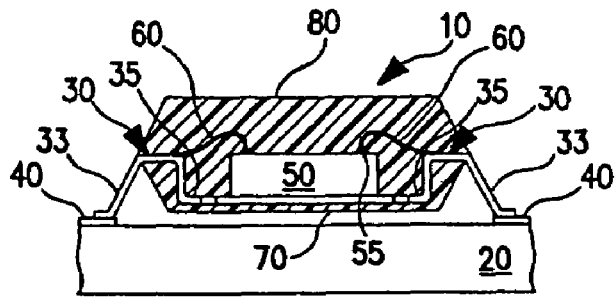
FIG. 2a is a cross-sectional view of a wire-bonded and leaded (with leads) near-chip scale package (CSP), showing connection to the next level of packaging by means of leads, according to prior art.
Figure 2D:
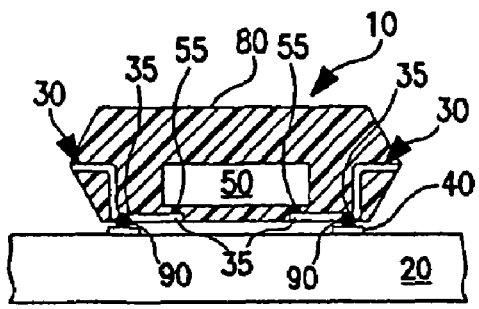
FIG. 2d is a cross-sectional view of a flip-chip and leadless near-CSP, showing connection to the next level of packaging by means of solder balls, according to prior art.
Figure 2B:
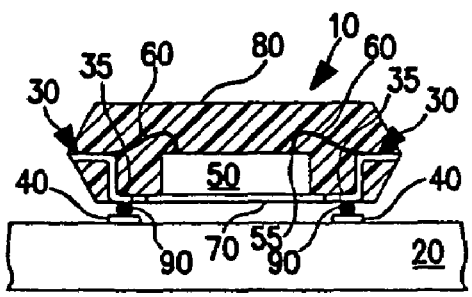
FIG. 2b is a cross-sectional view of a wire-bonded and leadless (with no leads) near-CSP, showing connection to the next level of packaging by means of solder bumps or balls, according to prior art.
Figure 3A:
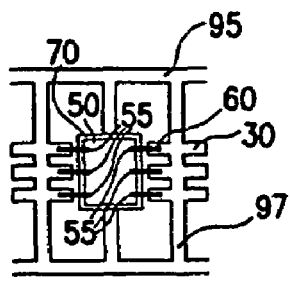
FIG. 3a is a top view of a stencil-like lead frame showing the wire bonded connection of a back-bonded chip to the leads of the lead frame, according to prior art.
Figure 2C:
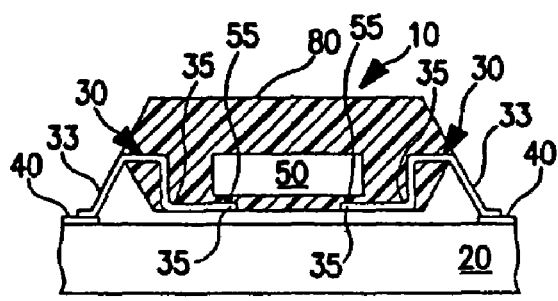
FIG. 2c is a cross-sectional view of a flip-chip and leaded near-CSP, showing connection to the next level of packaging by means of leads, according to prior art.
Figure 3B:
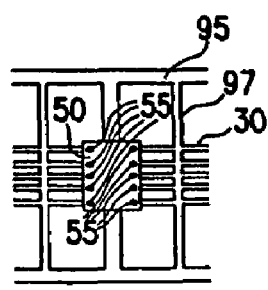
FIG. 3b is a top view of a stencil-like lead frame showing the connection of a flipped chip to the leads of the lead frame through a solder reflow process, according to prior art.
Figure 4:
FIG. 4 is a cross-sectional view of a metal film of uniform thickness pre-plated on both sides with a bondable material, according to the present invention.

FIG. 4 is a cross-sectional view of a film, preferably a sheet of metal, preferably copper, that is not only to be formed into a lead frame, but also to serve as a stable carrier during the ensuing process steps of forming the lead frame. The thickness of the strip of metal is equal to or greater than about 0.05 mm. In another embodiment, the thickness can be in the range between about 0.05 to 0.5 mm.

Forming a lead frame typically involves cutting through the strip of metal, like cutting a stencil, and then working with very fine finger-like leads. In order to hold down such a delicate structure in place, a vacuum chuck may be used. Conventional vacuum chucks, however, typically are not adapted to provide suction for such delicate devices and the lead frame must usually be clamped down peripherally. Any rigging used for this purpose must be refitted from one type and size of lead frame to another. The instant invention, however, alleviates this refitting step. Because the bottom surface of the partially patterned lead frame is solid and continuous, a conventional vacuum chuck can easily hold the lead frame in place during processing. Furthermore, one size strip of metal that can accommodate the various industrial lead frames can be used universally in the manufacture of the lead frames. The subsequent process steps of chip attach and wire bonding can be accomplished with much less stress and strain on the lead frame to be formed. Lead frames with much finer geometries can easily be fabricated because the leads are held together by the web-like structures and are not separated from each other until the very final step.

Forming of the various patterns on the lead frame can be accomplished in a number of ways. One approach can be stamping the pattern into the metal. Other approaches may include chemical or electrochemical milling and electrical discharge machining (EDM). On the other hand, photolithographic patterning, which is a mainstay of semiconductor manufacturing, is preferred. In the present invention, metal strip (100) shown in FIG. 4 is pre-plated on both the front (or top) side and the back (or bottom) side prior to the photolithographic patterning. Either or both the front surface and the back surface may be pre-plated with a material that enables bonding as well as solderability, respectively. In one embodiment, the front surface is pre-plated with a bondable material, such as Ni/Pd/Au-strike or Ag. In another embodiment, the back surface is pre-plated with a solderable material, such as Sn/Pb, lead-free solder, immersion-tin electroless-nickel or Au-strike. The pre-plating can be performed at a later step, if so desired.

Figure 5:
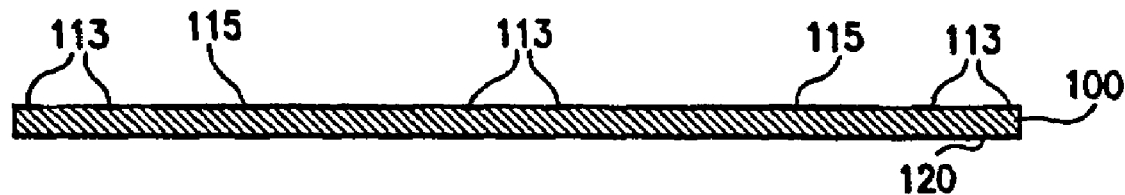
FIG. 5 is a cross-sectional view of a metal film of FIG. 4, where only the pre-plating on the top surface has been patterned corresponding to two chip sites with each site including a chip-pad and lead contacts surrounding each chip-pad, according to the present invention.

At the next step, the pre-plated front side (110) is photolithographically patterned to form areas corresponding to chip-pad (115) and electrical contacts (113) surrounding the chip-pad area. An electrical contact (113) can be characterized as the end portion of a lead that is connected to the chip-pad area (115) through a first region of intermediate recessed portions that forms the web-like structure. These intermediate recessed web-like portions are removed at a later time when metal film (100) is etched from the back so that the end portions and the chip-pad portions will be isolated from each other. The areas comprising a chip-pad (115) and the surrounding contacts (113) are sometimes referred to as chip sites. A plurality of chip sites can be formed on a continuous roll of copper sheet sprocketed to a spool to easily automate the forming of lead frames comprising one or more chip sites. FIG. 5 illustrates two chip sites, which will be formed into two corresponding lead frames, which in turn will be part of two packages that will be formed from them.

Figure 6:
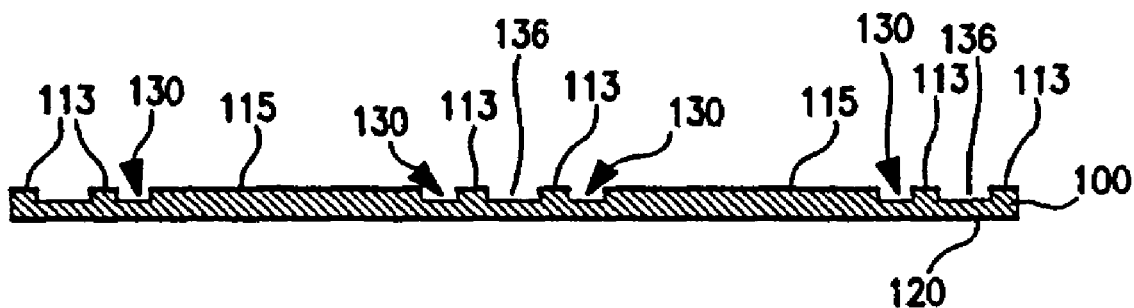
FIG. 6 is a cross-sectional view of the plated metal film of FIG. 4, which has been partially patterned, according to the present invention.

The pattern shown for the two chip sites illustrated in FIG. 5 is then transferred into film strip (100) by etching. As shown in FIG. 6, a main feature of the present invention is that the etching is performed only partially through the thickness of the metal, which is referred to herein as partial patterning. The partial patterning is performed in a first region of the film to form a webbed structure (130) that connects the chip pads (115) of lead contacts (113) of each lead frame. The first region also connects the lead frames to one another at street portions (136) of the film.

Figure 6B:
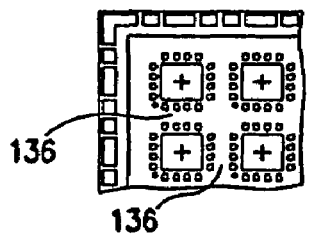
Figure 6C:
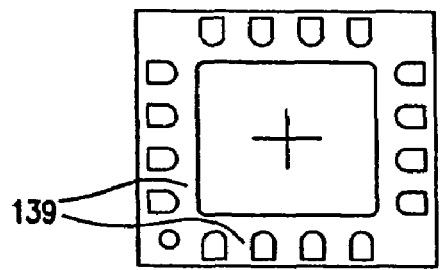
Figure 6A:
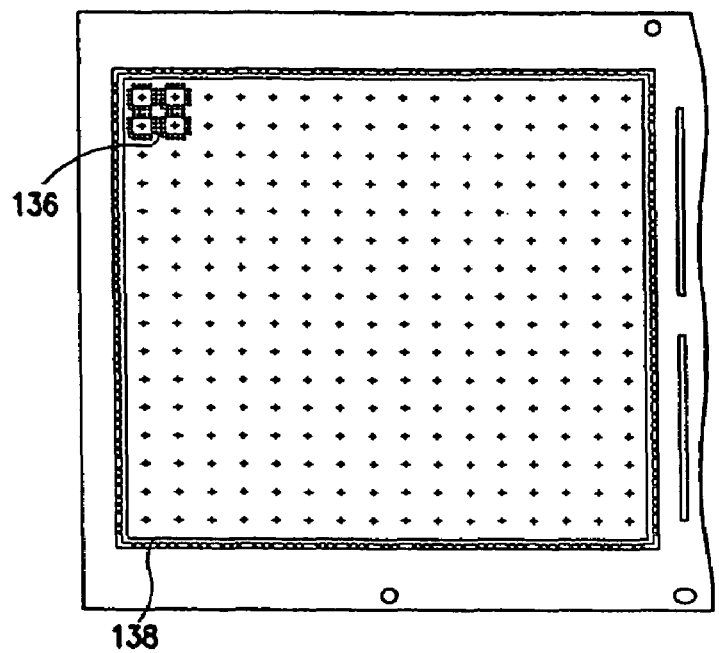
FIG. 6a is a top view showing a matrix of partially patterned lead frames according to the present invention.

As shown in FIGS. 6a-c, a matrix or such lead frames (for example, 16×16) may be formed in a block/window film (138). FIGS. 6b and 6c show that the first region includes the webbed structure (139) connecting the chip pad and lead contacts of each lead frame. The first region also connects the plurality of lead frames to one another at street portions (136) of the film.

In one embodiment, the partial patterning can vary from 25% to 90% of the thickness of the film. The partial patterning, however, may be virtually any percentage of the thickness of the film and the amount of partial etching can be determined by considering various factors affecting the manufacturability parameters, including flexibility, rigidity, and thermal thickness (or thermal conductance). The lateral dimensions of lead contact areas (113) and chip-pad areas (115) can be determined based on the degree of miniaturization desired for given chip sizes and wire bonds or other connecting media that may be used for interlevel or intralevel connections in a given package or between packages at the next level of packaging. It is especially noted that manufacturability concerns for fine features and dimensional stability of the lead frame are of lesser significance now by virtue of the web-like structure of the finger-like leads.

Figure 7:
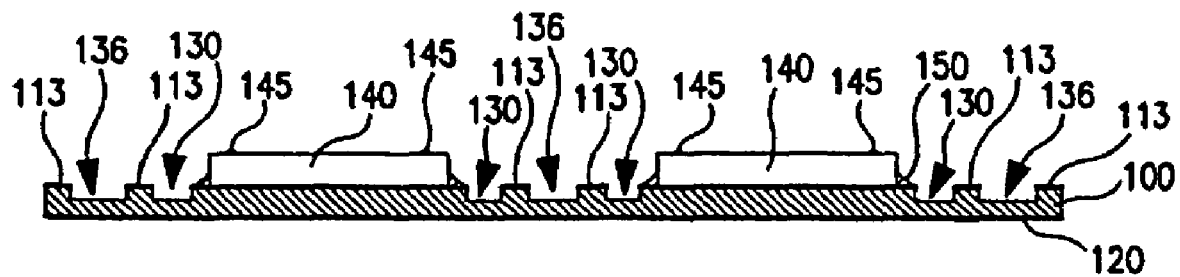
FIG. 7 is a cross-sectional view of the partially patterned metal film of FIG. 6 where a chip has been attached to the chip-pad on each of the two chip sites, according to the present invention.
Figure 8:
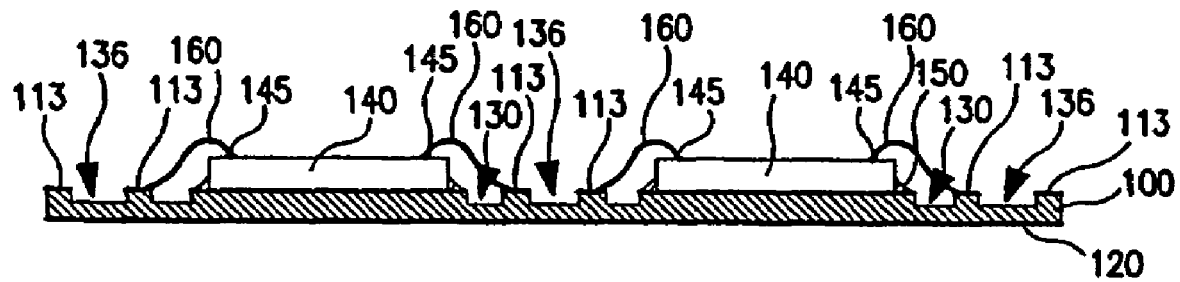
FIG. 8 is a cross-sectional view of the chip attached metal film of FIG. 7, where the terminals on each chip have been wire bonded to the lead portions of the lead frame so formed on each chip site, according to the present invention.

As shown in FIG. 7, chips (140) are next attached to the chip-pad areas preferably using an epoxy (150). The epoxy may be filled with conductive particles to enhance the cooling of the chip. The epoxy is cured and, as shown in FIG. 8, wires (160) are bonded to terminals (145) and to corresponding lead contacts (113) using well-known wire bonding techniques. Because the lead frame formed according to the present invention has a solid, continuous back side that is firmly seated and held down on a flat surface such as by a vacuum chuck (not shown), the web-like structure of the leads do not flutter or bounce during wire bonding. This results in excellent bonds, which improves the reliability of the end product.

Figure 9:
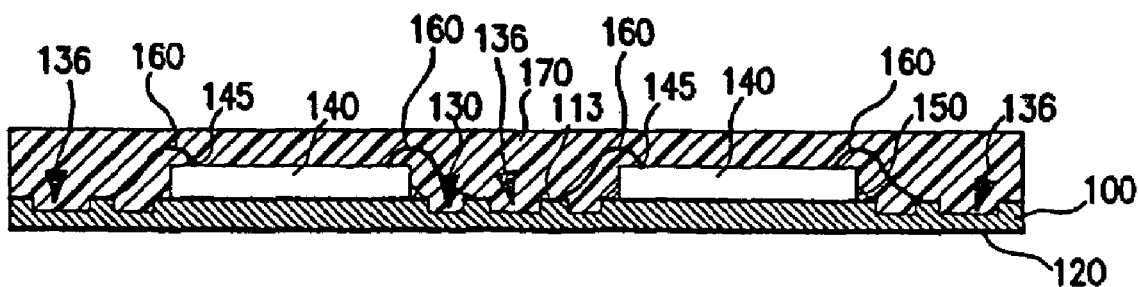
FIG. 9 is a cross-sectional view of the wire bonded lead frame of FIG. 8 where the top surface of the metal film, including the chips and the wire bonds have been hermetically sealed in an encapsulant, according to the present invention.

In FIG. 9, after connecting the chips and the corresponding contacts, all the components on the front side of the metal film are then hermetically encapsulated in a molding material, for example, by a resin. Encapsulant (170) is formed over the film and all exposed surfaces, including the lead frames and their associated wires (160), chips (140) and contacts (113) as well as the webbed structure (130) and street portions (136). When the resultant molded package is lifted up, the clean backside is now available for further processing. The commonly encountered problem of mold flashing to the footprint on the underside of the package is eliminated with this disclosed method.

Figure 10:
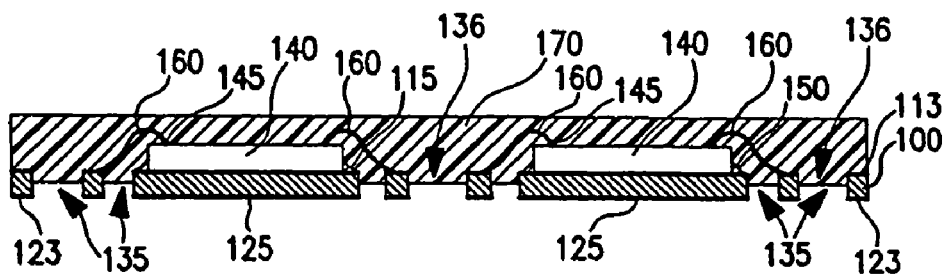
FIG. 10 is a cross-sectional view of the hermetically sealed package of FIG. 9 that has been etched from the backside to remove the first region of each lead frame and the street regions in the film) according to the present invention.

As shown in FIG. 10, both the lead contacts (113) and the chip-pads (115) can now readily be isolated from one another to form their own islands by etching the webbed structure (135) of the first region through the back side of the package. At this point, the street portions (136) are also back etched. The back etching continues until the molding material is reached. The etch method for back etching the metal should be the same as that used for the front side. The etch time for the back side, however, may differ from that used for the front side, depending upon the degree of partial etching that was performed from the front side. Thus, the initial forming of the partial etch lead frame can be custom tailored to fit the manufacturing requirements for automation, quality, reliability and functionality of the final package.

Figure 11:
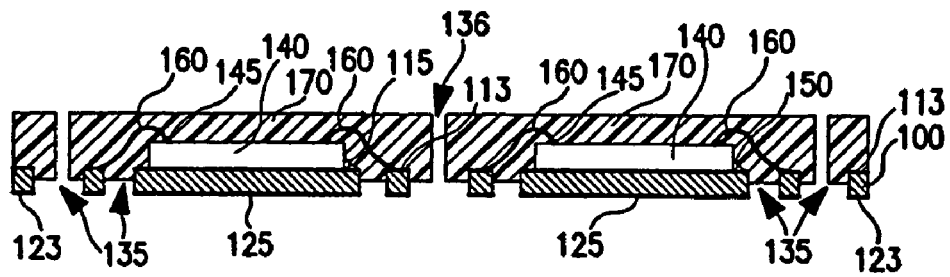
FIG. 11 is a cross-sectional view of two near chip size partially patterned packages wherein the encapsulant has been singulated in the street regions, according to the present invention to form two separate packages.

As a final step, the encapsulant (170) over the street portions (136) between the lead frames is singulated to form two individual packages as shown in FIG. 11. This is accomplished in a number of ways, including saw slicing, water-jet-cut, laser-cut, or a combination thereof, or other techniques that are especially suitable for cutting plastics. In other words, there is no more metal to cut through and hence no delamination and other problems associated with cutting plastic and metal in combination. This is to be compared with conventional packages, where bridging metal between streets must be cut at the same time that the package is being singulated. Many times, when cutting both metal and plastic at the same time, some of the metal chips can short lines and contacts, causing unwanted and unpredictable wear on the saw blades. As shown in FIG. 6*a*, this method may also be applied to produce a great number of packages from a matrix of lead frames.

Figure 12A:
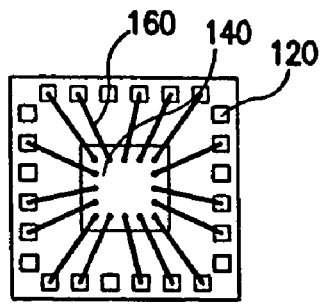
FIG. 12a is a top view of one of the singulated packages of FIG. 11 showing the chip, the contacts and the wires connecting the chip terminals to the lead contacts, and an enlarged cross section of one of the contacts with a wire bond, according to the present invention.
Figure 12B:
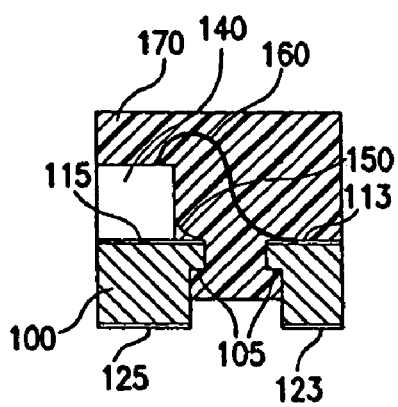
FIG. 12b is a cross-sectional view of the area between the chip-pad and one of the contacts showing the use of a "lip" on the vertical surfaces that come into contact with the molding material in order to provide anchoring and prevent delamination, according to the present invention.
Figure 12C:
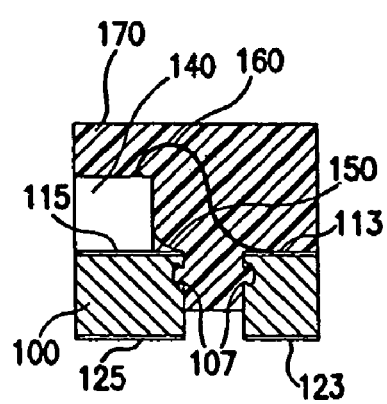
FIG. 12c is a cross-sectional view of the area between the chip-pad and one of the contacts showing the use of different shapes of cavities on the vertical surfaces that come into contact with the molding material in order to provide anchoring and prevent delamination, according to the present invention.
Figure 13A:
FIGS. 13a-13f are diagrams of various cavities that can be used to provide anchoring means for molding material on the vertical surfaces shown in FIGS. 12b and 12c, according to the present invention.
Figure 13D:
Figure 13B:
Figure 13E:
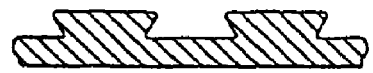
Figure 13C:
Figure 13F:
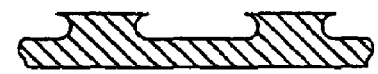

A top view of a singulated ELP is shown in FIG. 12*a*, where contacts (120) and chip (140) are shown isolated from one another on their own islands, but only connected with each other through wires (160) that have been wire bonded. FIG. 12*b* shows an enlarged view of a corner of the package between the chip and one of the contacts comprising a portion of the original metal strip (100), a top surface pre-plated to form bondable layer (113), and a bottom surface pre-plated to form solderable layer (123). In FIG. 12*b*, a "lip" is shown both on the contact and the corner of the chip.

The pre-plated surface (120) on the underside of the package can now be used for several purposes. First, direct external access to is the back (125) of chip-pad (140) provides an additional heat path for cooling. Second, contacts (123) within the footprint of the near-chip size package (CSP) make it possible to mount tightly spaced packages at the next level of packaging, and hence increase performance for the same area.

Another aspect of the present invention provides a means for lessening the possibility of delamination between the molding material and the surfaces to which it should adhere. This is accomplished by half-etching the edges around the chip-pad and the contact areas to form a ledge or a "lip", such as referenced by numeral (105) in FIG. 12*b*. It is also possible to form irregularly shaped cavities (107) shown in FIG. 12*c* to enhance the interlocking mechanism of the surfaces that come into contact with the molding material. Enlarged views of various other cavities are also shown in FIGS. 13*a*-13*f*, and forming of these surface enhancements can readily be incorporated into the partial etching from the front side. This will not be necessary for etching from the backside inasmuch as the molding material encapsulates only the surfaces that are formed partially from the front side.

Figure 14:
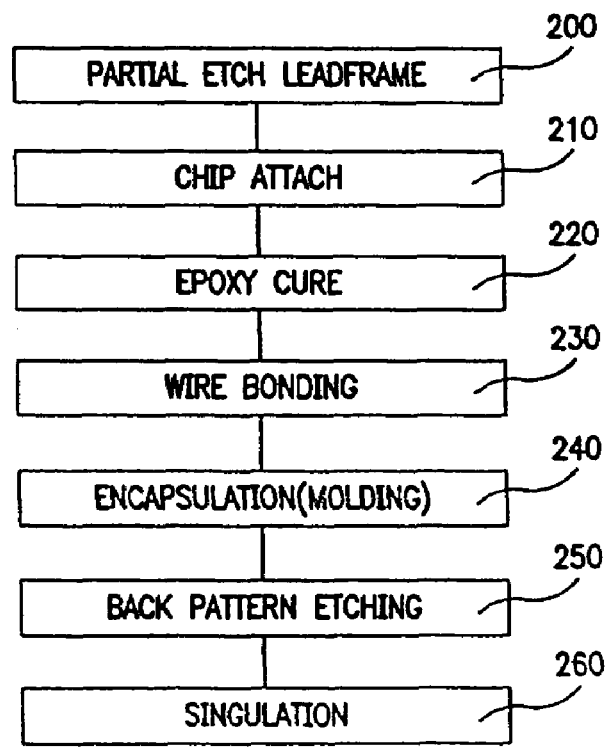
FIG. 14 is a flow chart summarizing the various process steps of forming a partially patterned package, according to the present invention.

FIG. 14 summarizes the method of the present invention as commencing with the partial etching of a lead frame (200) into a metal strip from the front side and ending with the back pattern etching (250) of the same metal strip in such a way so as to form the desired chip-pad and the surrounding contacts. The intermediate steps of chip attach (210), epoxy cure (220), wire bonding (230), and encapsulation (240) are all accomplished on a mechanically and thermally stable lead frame, because the leads are still connected through the first region of intermediate recessed portions on a partially etched web-like or webbed structure in the metal film. It is also important to note that it is only after all the components of the package have been secured in an encapsulant that the first region of intermediate recessed portions is removed through back pattern. etching (250), and the peripheral contacts as well as the chip-pad are made to separate from each other for proper isolation. Consequently, there is no need to cut through any metal during singulation (260) into single near chip-size packages.

Figure 15A:
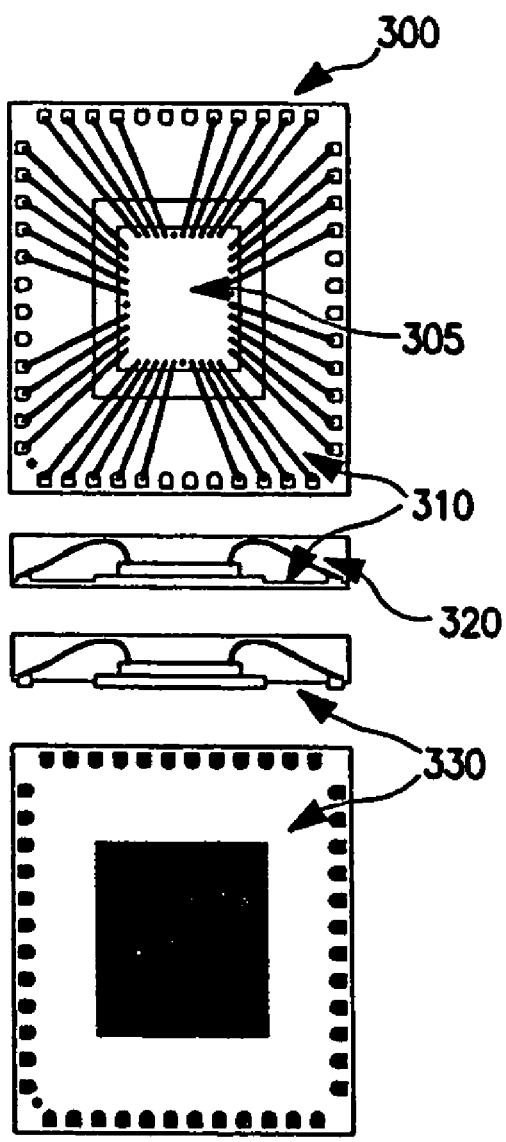
FIG. 15a is a diagram showing the top, side and bottom views of a package with a peripheral I/O configuration, according to the present invention.
Figure 15B:
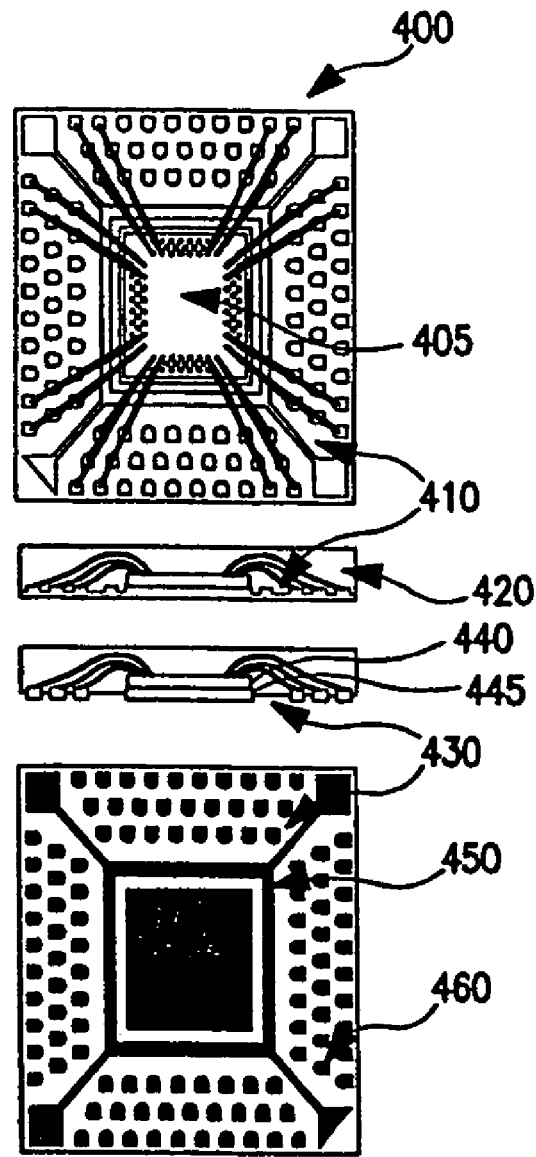
FIG. 15b is a diagram showing the top, side and bottom views of a package with an array configuration of I/O pads, according to the present invention.

The method of the present invention may be used to form a wide variety of packages, such as an array type of a lead frame for an electronic package. A top view of an array type package (400) is shown in FIG. 15*b* next to the standard peripheral type package (300) shown in FIG. 15*a*. While numeral (305) references a peripheral arrangement of chip terminals, numeral (405) references an array type arrangement of the terminals, which can be configured in-line or staggered. Both packages are formed using the disclosed partial patterning invention as indicated by reference numerals (310) and (410). In the array type ELP, inner leads (440) and outer leads (445) are shown. Both packages are encapsulated in molding material (320) or (420). Back pattern etching to isolate the contacts and the chip are indicated by (330) and (430) is Numeral (450) depicts a ground ring feature, which is etched to the same level as the mold. Numeral (460) points to the array type input/output configuration on the bottom view of the ELP.

The second embodiment shown in the drawings 16-24*b* discloses a method of forming a partially patterned VFQFP-N type lead frame which is especially suitable for mass producing FC electronic packages. The lead frame made to accommodate the flip-chip will, hereafter, be referred to as FCL to distinguish it from conventional lead frames. This is because, unlike conventional lead frames, FCLs are sturdier and much more adaptable to automated manufacturing lines, as described below.

FCLs are also web-like structures in contrast to the conventional all-purpose punched through, stencil-like lead frames. The front side of a web-like FCL has recessed sections, including partially patterned leads, while the back side is solid and flat. This provides mechanical rigidity to perform without distortion or deformation during the manufacturing processes. After the completion of the chip attach and hermetic sealing of the package, the backside is etched to isolate the lead contacts from each other. Subsequently, the resultant encapsulated package is singulated without having to cut into any additional metal. Thus, it will be apparent that FCLs with much finer geometries, such as with VFQFP-N packages, can easily be fabricated in as much as the leads are held together by the web-like, or webbed structures and not totally separated from each other until the very final step of singulation.

Figure 16:
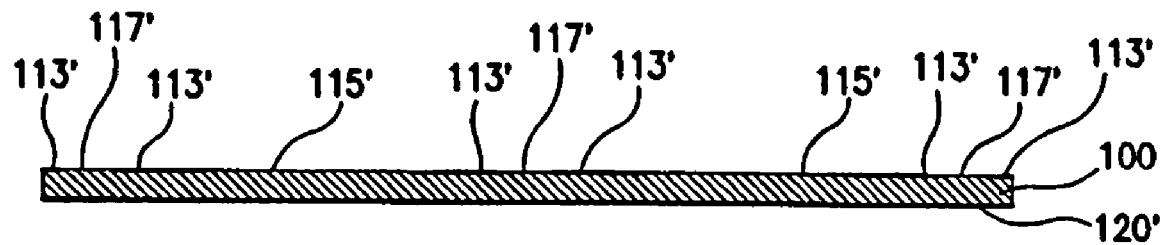
FIG. 16 is a cross-sectional view of a metal film of FIG. 4, where only the pre-plating on the top surface has been patterned corresponding to two flip-chip sites With each site including a chip receiving area and leads surrounding each chip receiving area, according to the present invention.
Figure 17:
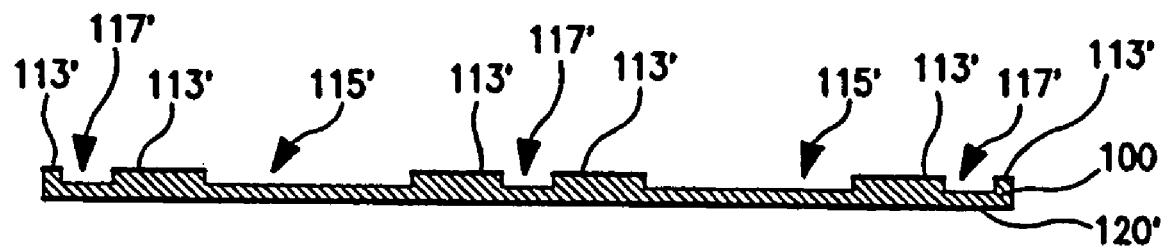
FIG. 17 is a cross-sectional view of the plated metal film of FIG. 16, which has been partially patterned to form a web-like lead frame (i.e., webbed structure), according to the present invention.

Like the already disclosed partially patterned lead frame of the first embodiment, the FCL of the second embodiment is also formed from a sheet of metal, preferably copper film as shown in FIG. 4, where both the front surface and the back surface are pre-plated, or, as stated previously, the plating can be deferred to a later step. (It is noted that, as the process steps for both embodiments are similar, the reference numerals have been kept the same as appropriate except for denoting those of the second embodiment with primes. The same reference numeral (100) has been kept for consistency for the metal film used for both embodiments). Then, the pre-plated front side (110') is photolithographically patterned to form chip receiving areas (115'), lead portions. (113') surrounding the chip receiving areas, and other intermediate areas (117'). At a subsequent process step that is disclosed below, one end portion of the leads will be connected to the terminals of an FC, while the other end portion will be connected to the next level of packaging. The areas comprising a chip receiving area and the surrounding leads are sometimes referred to as a chip site, similar to the chip sites with wire-bonded chips. A plurality of lead frames to comprising a plurality of chip sites can be formed on a continuous roll of copper sheet sprocketed to a spool to easily automate the forming of lead frames comprising one or more chip sites. FIG. 16 illustrates two chip sites, which will be formed into two corresponding lead frames, which in turn will be part of two packages that will be formed from them.

The pattern shown for the two chip sites illustrated in FIG. 16 is then transferred into metal film (100) by partial patterning through etching. The partial patterning shown in FIG. 17 may be up to one-half, one-quarter, or for that matter, any ratio of the thickness of the strip of metal, and the amount of partial etching can be determined by considering various factors affecting the manufacturability parameters including flexibility, rigidity, and thermal thickness (or thermal conductance). The lateral dimensions of lead contact areas (113') and chip areas (115') can be determined based on the degree of miniaturization desired for given chip sites including the chip size and the leads that may be used for interlevel or intralevel connections in a given package or between packages at the next level of packaging. It is especially noted that manufacturability concerns for fine features and dimensional stability of the lead frame are of lesser significance now by virtue of the webbed structure of the finger-like leads.

Figure 18:
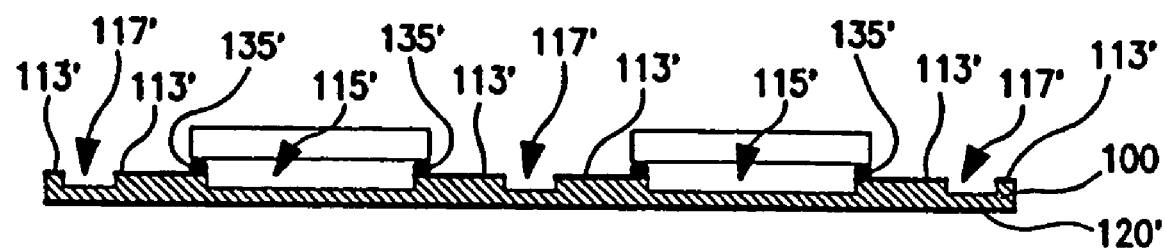
FIG. 18 is a cross-sectional view of a chip-joined lead frame (FCL) showing the flip-chip (FC) joining, according to the present invention.

Flip-chip. (FC) (130') is then flipped over so that terminals (135') on the front side of the chip rest on one end portion of the leads as shown in FIG. 18. At a later step, the opposite end of the leads will be formed into electrical contacts for connection to the next level of packaging, such as a card or a board. First, however, chips assembled on the web-like lead frame structure shown in FIG. 18 are sent through a chip joining furnace as is practiced in the art. The solder balls are reflowed so that the reflow is limited by the BLM, thus forming solder pillars. Since the lead frame formed according to the present invention has a solid, continuous back side that is firmly seated and held down on a flat surface, the web-like structure of the leads do not flutter or bounce around in the chip-joining furnace, thereby yielding excellent chip joining. Consequently, the disclosed method improves the reliability of the end product, namely, that of the VFQFP-N type packages.

Figure 19:
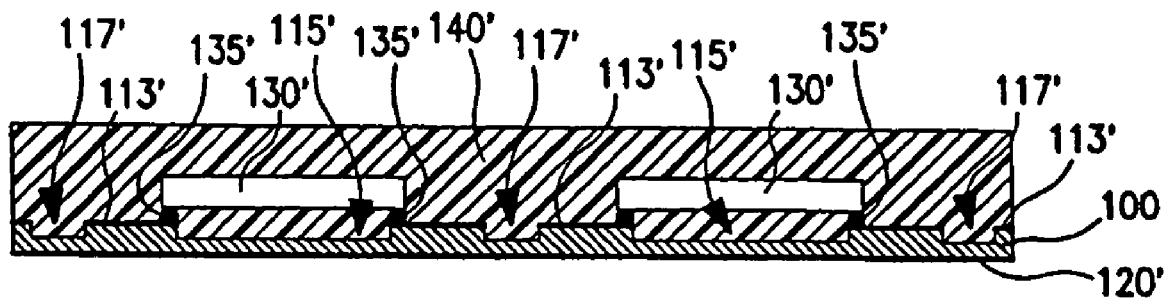
FIG. 19 is a cross-sectional view of the FCL of FIG. 18 where the top surface of the metal film, including the chips, have been hermetically sealed in an encapsulant, according to the present invention.

After chip joining, the chips, along with the partially patterned leads on the front side of the original metal film, are then hermetically. encapsulated in a molding material, for example, by a resin, as shown in FIG. 19. Encapsulant (140') is formed around all exposed surfaces, including that of leads (113'), around solder balls (135'), underneath the chips, along the vertical walls of recessed chip receiving areas, (115') as well as that of the vertical walls of recessed areas (117') except for the unetched, solid and flat back side of strip of metal (100) that is held down firmly onto a flat surface. When the resultant molded package is lifted up, the clean backside is now available for further processing. The commonly encountered problem of mold flashing to the footprint on the underside of the package is eliminated in this embodiment as well.

Figure 20:
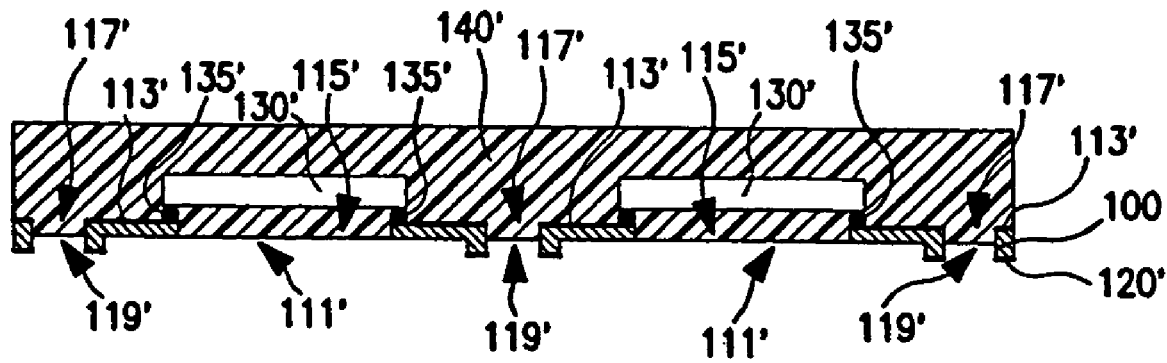
FIG. 20 is a cross-sectional view of the hermetically sealed. package of FIG. 19 that has been etched from the backside to remove selectively the webbed portions between the individual leads and between the recessed chip receiving areas, according to the present invention.

Leads (113') can now readily be isolated from one another by patterning through the back side of the package in alignment with the pattern that was partially etched from the front side at the beginning of the process. The back etching continues until the molding material is reached. This is shown in FIG. 20 where web-like portions of the lead frames, namely areas (111') and (119'), are removed to disconnect chip areas (115') from each other, and leads (113') from each other. It is preferred that the etch recipe for back patterning the metal be the same as the recipe that was used for partial etching from the front side. However, the etch time from the back side may differ from that used for the front side depending upon the degree of partial etching that was performed from the front side. Thus, the initial forming of the partial etch lead frame can be custom tailored to fit the manufacturing requirements for automation, quality, reliability and functionality of the final package.

Figure 21:
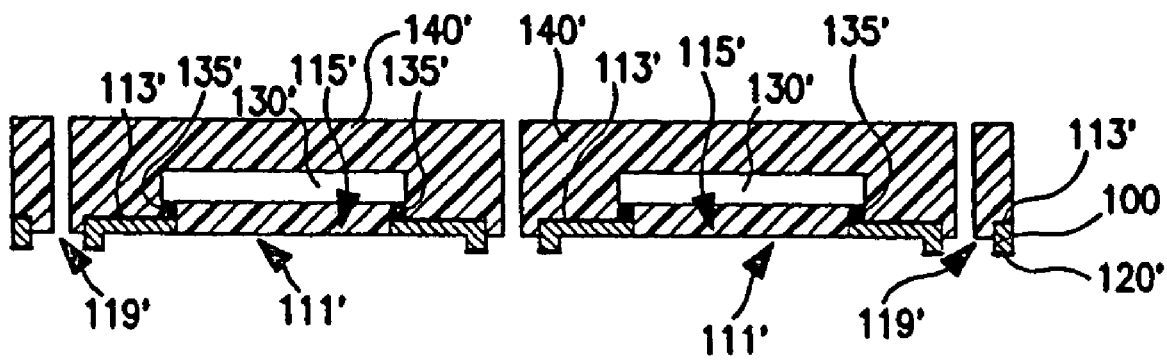
FIG. 21 is a cross-sectional view of two near chip size partially patterned packages that have been singulated from the package of FIG. 20, according to the present invention.
Figure 22A:
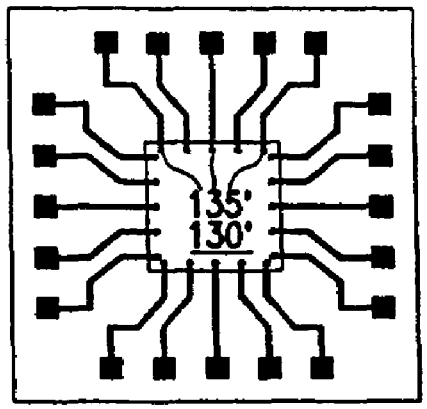
FIG. 22a is a top view of one of the singulated packages of FIG. 21 showing the chip and the leads connecting the chip terminals to the end portions of the leads, which are in turn connected to the next level of packaging, according to the present invention.
Figure 22B:
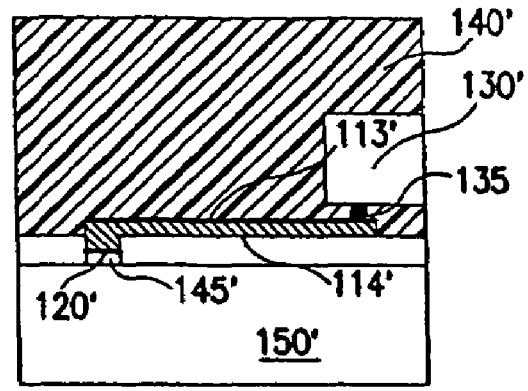
FIG. 22b is an enlarged cross-sectional view of the area between the flip chip and the connection to the next level packaging showing the two end connections of a lead, according to the present invention.

As a final step, the package of FIG. 20, having two encapsulated chip sites for the purposes of illustrating the present invention, is next singulated into singular near-chip size packages (CSPs), which are more of the VFQFP-N type packages, as shown in FIG. 21. A top view of a singulated partially patterned lead frame package is shown in FIG. 22*a*, where leads (113') are shown isolated from one another and connected to solder balls (135') on the underside of chip (130'). FIG. 22*b* shows an enlarged view of a corner of the package between the chip and one of the leads connected to an external contact (145') that may be provided on a card or a board (150'). The pre-plated surface (120') is already prepared to be joined to the next level of contact as shown in the same Figure. Also, the underside (114') of leads (113') are exposed to the ambient environment, thus providing enhanced cooling.

The same techniques as disclosed before may be used to prevent the delamination of the encapsulant from the surfaces of the FCL, namely, by incorporating the irregularly shaped cavities of FIGS. 13*a*-13*f* on the vertical walls of the recessed areas (115') and (117') of the webbed lead frame. The forming of these surface enhancements can readily be incorporated into the partial etching from the front side. This will not be necessary for etching from the backside inasmuch as the molding material encapsulates only the surfaces that are formed partially from the front side.

Figure 23:
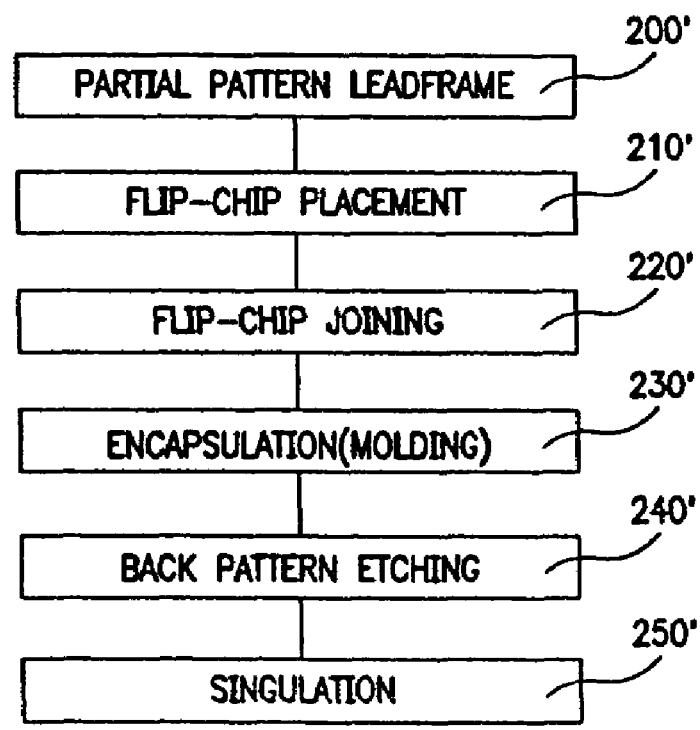
FIG. 23 is a flow chart summarizing the various process steps of forming a partially patterned package supporting a flip-chip, according to the present invention.

FIG. 23 summarizes the method of the present embodiment as commencing with the partial patterning of a lead frame (200') into a metal strip from the front side and ending with the back patterning (240') of the same metal strip in such a way so as to form the desired chip receiving areas and the surrounding leads. The intermediate steps of FC placement (210'), FC chip joining (220'), and encapsulation (230') are all accomplished on a mechanically and thermally stable FCL because the leads are still connected through the partially etched web-like structure in the metal film. It is also important to note that it is only after all the components of the package have been secured in an encapsulant that the web portions of the leads are removed selectively through back pattern etching (240'), and the leads are made to separate from each other for proper isolation. Consequently, there is no need to cut through any metal during singulation (250') into single near chip-size package.

Figure 24A:
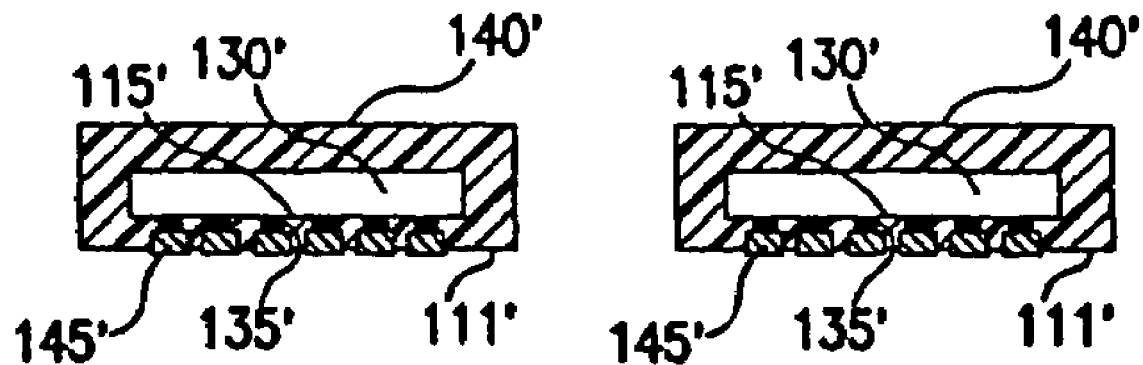
FIGS. 24a and 24b show a cross-sectional view and a bottom view of two near chip size partially patterned packages that have been singulated, and then provided with ball grid array connectors for connection to the next level of packaging to form an ELGA-type package, according to the present invention.
Figure 24B:
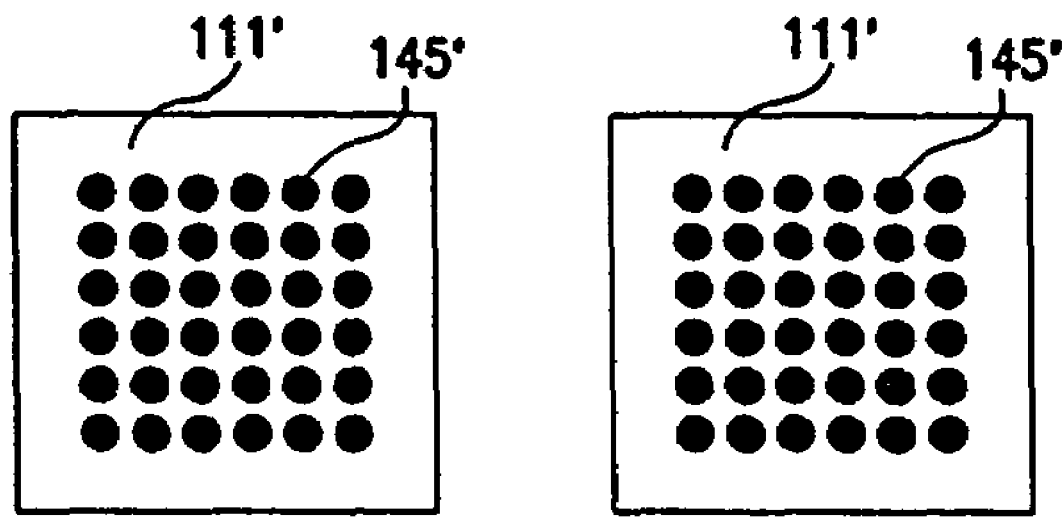

The method of the invention may be used to form a wide variety of packages, such as an array type of a partially patterned lead frame where an area array of solder bumps can be chip joined simultaneously on to the lead frame with the chip flipped over, similar to the method disclosed herein with a peripheral set of solder bumps. Also, an array of partially patterned lead frames themselves can be formed simultaneously, and then FC joined also simultaneously, followed by singulation of the array into a multiplicity of separate VFQFP-N type packages. Also, each resulting CSP can then be provided with solder bumps, pads, or other electrical connections underneath the package for array type joining on to the next level of packaging to form an etched lead frame package with ball grid array, or ELGA-type package shown in FIGS. 24a and 24b. In FIG. 24a, a cross-sectional view is shown where chip pads (135') are formed over the leads (145'). Subsequent to the back-patterning, leads (145') are electrically isolated from each other to be joined to the next level of packaging. The exposed bottom surfaces of (145') can be flash finished with any number of solderable materials through immersion-tin dipping or electroless-nickel plating. The bottom surface (111') of the ELGA package is shown in FIG. 24b with an array pattern for the electrical connections (145').

The invention promotes a number of advantages in the manufacturing process for electronic packages. For example, after the back etching and prior to singulation, a block of packages will inherently be ready for strip testing while the packages are still arranged in the block. This provides a significant advantage as compared to handling the packages as individual units. Strip testing the packages while they are arranged in a block improves the reliability of the test.

The invention also enables a manufacturer to produce packages having dual or triple rows of staggered leads that can multiply I/O capacity of a given package. The flat continuous bottom surface of the lead frames enables the use of universal assembly equipment, which does not need refitting for each application, and which is completely flexible for automation. For example, processing between 2×2 through 12×12 package blocks does not require any mechanical change. In addition, the invention easily facilitates the construction of packages having a "stand off" for each foot (for example, at 2 mils between the bottom of the molded body at the surface of the foot). The stand off provides additional advantages when the chip packages are to be connected to the next level of packaging, such as a board.

While the invention has been particularly shown and described with reference to particular embodiments, those skilled in the art will understand that various changes in form and details may be made without departing from the spirit and scope of the invention.

What is claimed is:

1. A method of forming a partially patterned lead frame comprising the steps of:
    forming a metallic film having a top surface and a uniform preplated bottom surface; and
    partial patterning the film from the top surface, but not entirely through the bottom surface of the film in a first region to form a webbed structure interconnecting a second region not partially patterned from the top surface;
    wherein the second region has (a) a chip pad area for supporting an integrated circuit (IC) chip and, (b) a plurality of electrical leads electrically separated from the pad area, the leads for providing electrical connections to the IC chip.

2. The method according to claim 1, wherein the film comprises copper or a copper alloy.

3. The method according to claim 1, wherein the film has a thickness of equal to or greater than 0.05 mm.

4. The method according to claim 1, wherein the partial patterning comprises removing about 25% to 90% of the thickness of the film.

5. The method according to claim 1, further comprising the step of pre-plating the top surface of the film.

6. The method according to claim 1, further comprising the step of pre-plating the top surface and the bottom surface of the film.

7. The method according to claim 5 or 6, wherein the pre-plating of the top surface comprises using a wire bondable material.

8. The method according to claim 7, wherein the bondable material comprises Ni/Pd/Au or Ag.

9. The method according to claim 6, wherein the pre-plating of the bottom surface involves using a solderable material.

10. The method according to claim 9, wherein the solderable material is Sn/Pb, lead-free solder, immersion-tin, electroless-nickel or Au-strike.

11. The method according to claim 1, wherein the first region has exposed vertical walls having irregular shapes to form interlocking surfaces when engaged with other materials.

12. The method according to claim 1, wherein the chip pad area comprises the end portions of the electrical leads to accommodate the solder bump joining of a flip-chip.

* * * * *